(12) United States Patent  (10) Patent No.: US 9,265,171 B1
Szeremeta  (45) Date of Patent: Feb. 16, 2016

(54) SELF-ALIGNING BRACKET ASSEMBLY

(71) Applicant: Western Digital Technologies, Inc., Irvine, CA (US)

(72) Inventor: Wally Szeremeta, Mission Viejo, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/314,942

(22) Filed: Jun. 25, 2014

Related U.S. Application Data

(60) Provisional application No. 61/986,668, filed on Apr. 30, 2014.

(51) Int. Cl.
G06F 1/16 (2006.01)
H05K 5/00 (2006.01)
H05K 7/00 (2006.01)
H05K 7/14 (2006.01)

(52) U.S. Cl.
CPC .................................... H05K 7/14 (2013.01)

(58) Field of Classification Search
CPC .............................. G11B 33/08; G06F 1/181
USPC ........ 248/27.1, 27.3, 220.21, 221.11, 222.11, 248/222.12, 223.41, 225.11; 312/223.2, 312/334.5, 334.4; 361/679.34, 679.31, 361/679.33, 679.36, 679.38, 679.39
See application file for complete search history.

(56) References Cited

U.S. PATENT DOCUMENTS 3,750,993 A * 8/1973 Read ........................... 248/298.1
3,986,318 A * 10/1976 McConnell ................... 403/384
4,754,397 A * 6/1988 Varaiya et al. ........... 361/679.39
5,128,830 A * 7/1992 Deluca et al. ................. 361/695
5,333,098 A    7/1994 Deluca et al.
6,230,910 B1 * 5/2001 Olsson et al. ................. 211/192
6,443,320 B1 * 9/2002 Herzog et al. ................ 211/192
6,744,903 B1   6/2004 Jeon
7,515,407 B2 * 4/2009 Goodman et al. ........ 361/679.34
7,679,896 B2 * 3/2010 Deng et al. ............... 361/679.33
7,701,705 B1   4/2010 Szeremeta
7,835,147 B2  11/2010 Merz et al.
8,050,028 B2  11/2011 Merz et al.
8,064,194 B2  11/2011 Szeremeta
8,113,873 B1   2/2012 Sarraf
8,133,426 B1   3/2012 Yurchenco et al.
8,358,395 B1   1/2013 Szeremeta
8,417,979 B2   4/2013 Maroney
8,462,460 B1   6/2013 Szeremeta et al.
8,498,088 B1   7/2013 Klein
8,547,658 B1  10/2013 Szeremeta
8,582,300 B2 * 11/2013 Liang et al. ................... 361/724
2003/0011974 A1 * 1/2003 Curlee et al. .................. 361/683

(Continued)

*Primary Examiner* — Terrell McKinnon
*Assistant Examiner* — Michael McDuffie

(57) ABSTRACT

A self-aligning bracket assembly can be used for many purposes, including for attaching a shock mount to a data storage device. The bracket assembly can include a plate having a first side and a second side opposite the first side. A surface of the plate on the first side can be adjacent a data storage device for mounting thereon. The plate may further include a raised and/or sunken portion forming an open space or gap between the surface and the portion and thereby forming an open space between the plate and the data storage device. An opening can extend through the plate at the raised or sunken portion. The opening can have a chamfer formed in the plate to receive a screw for mounting the bracket assembly. When used for a shock mount, the bracket may further include a shock mount extending from the plate.

22 Claims, 10 Drawing Sheets

(56) References Cited

U.S. PATENT DOCUMENTS

| | | | | |
|---|---|---|---|---|
| 2003/0198012 A1* | 10/2003 | Lin | ........................ | G06F 1/184 361/679.35 |
| 2008/0074837 A1* | 3/2008 | Denny et al. | .................. | 361/685 |
| 2008/0259554 A1* | 10/2008 | Qin et al. | ...................... | 361/685 |
| 2009/0129009 A1* | 5/2009 | Zhang et al. | ............. | 361/679.34 |
| 2010/0091444 A1* | 4/2010 | Reid | .................... | G06F 1/1616 361/679.37 |
| 2010/0302722 A1* | 12/2010 | Kang | ................... | G11B 33/124 361/679.31 |
| 2011/0090633 A1* | 4/2011 | Rabinovitz | ............... | 361/679.31 |
| 2012/0104222 A1* | 5/2012 | Ding | ................... | G11B 33/124 248/634 |
| 2013/0003290 A1* | 1/2013 | Chen | ....................... | 361/679.34 |
| 2013/0015317 A1* | 1/2013 | Huang | .................. | G11B 33/08 248/636 |

* cited by examiner

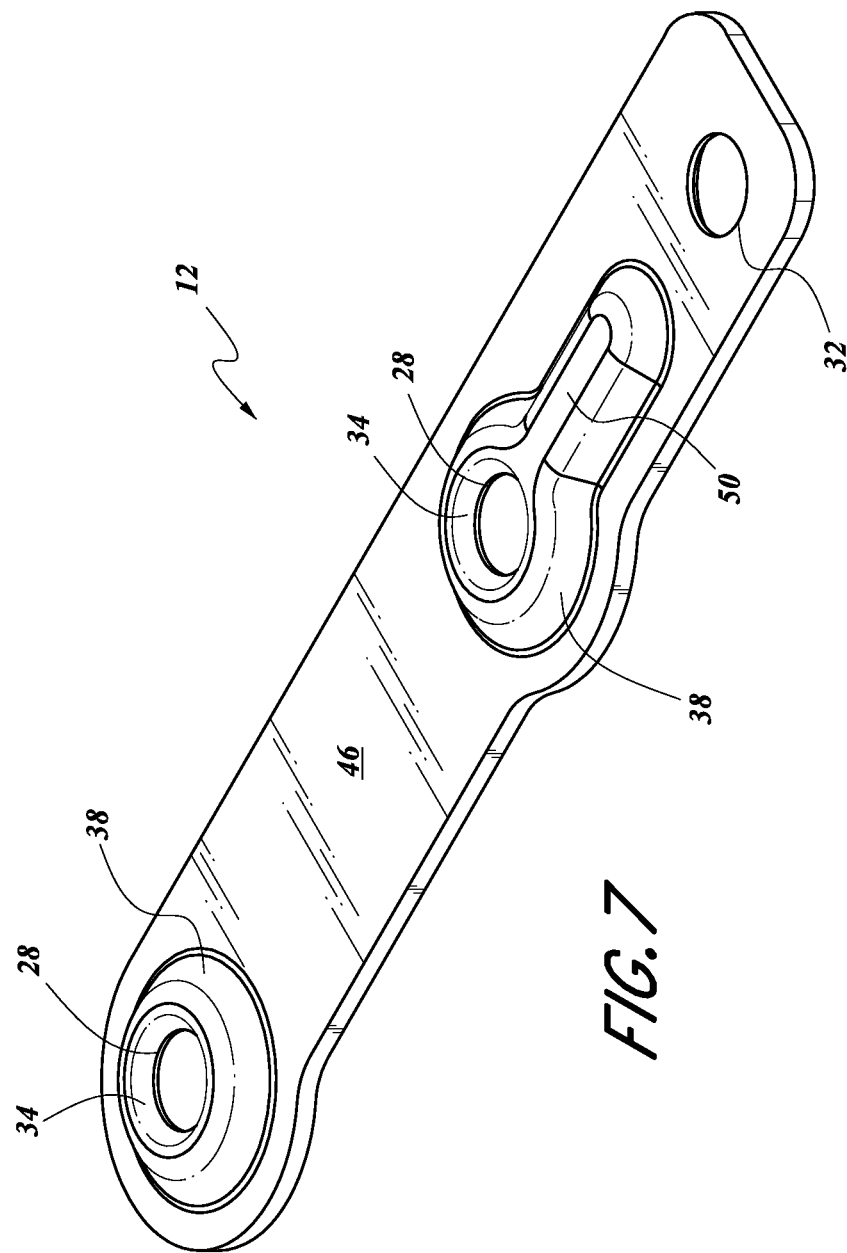

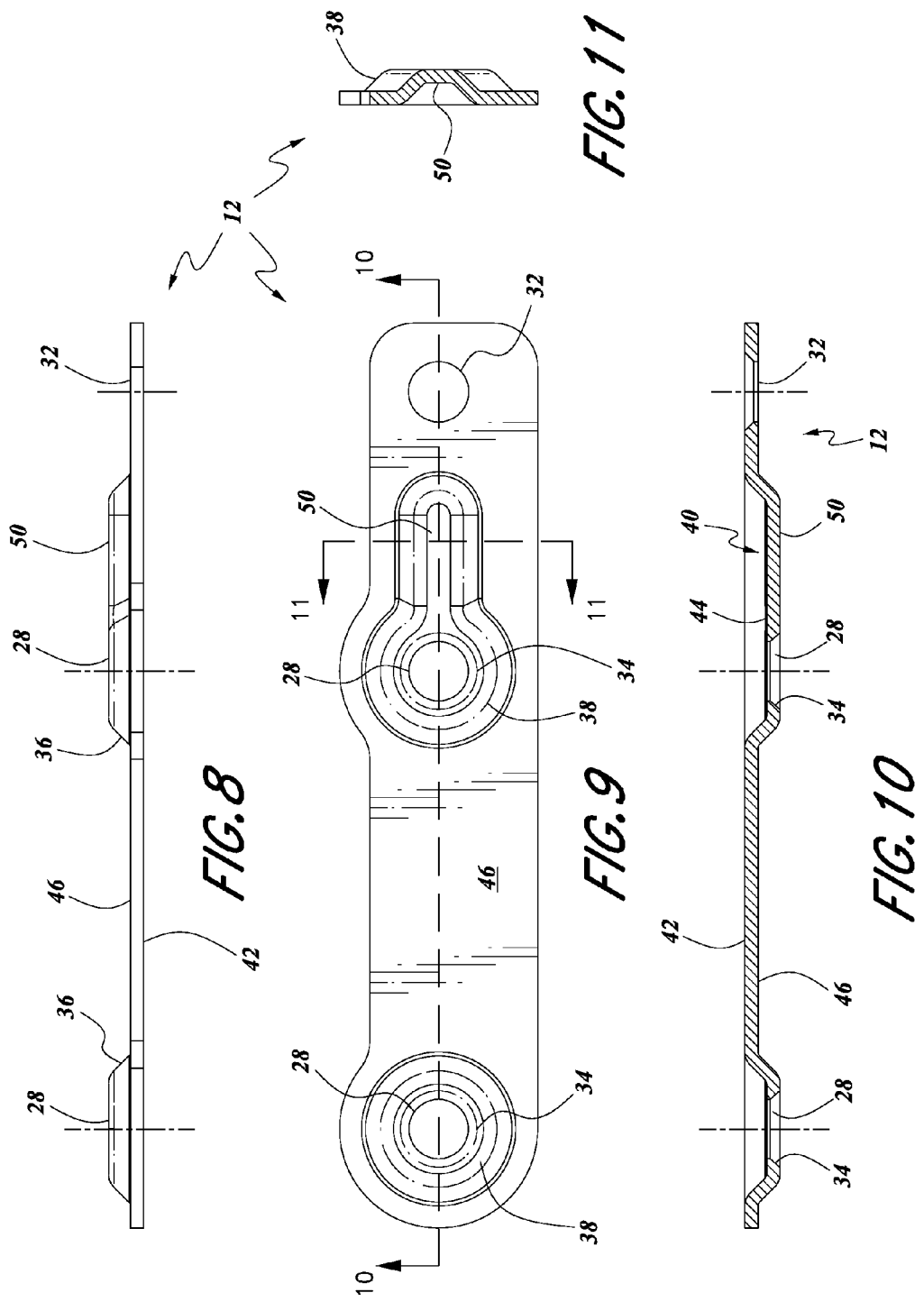

SELF-ALIGNING BRACKET ASSEMBLY

CROSS-REFERENCE TO RELATED APPLICATIONS

This application claims priority to U.S. Provisional App. No. 61/986,668 filed Apr. 30, 2014 which is hereby incorporated herein by reference in its entirety and is to be considered a part of this specification. Any and all priority claims identified in the Application Data Sheet, or any correction thereto, are hereby incorporated by reference under 37 CFR 1.57.

BACKGROUND

A hard disk drive (HDD) is a storage drive used for storing and retrieving digital information. A HDD generally has one or more rapidly rotating disks with a magnetic head arranged on a moving actuator arm to read and write data to the disk surface. A typical disk is spun at speeds varying anywhere from 4,200 rpm in energy-efficient portable devices, to 15,000 rpm for high performance servers. Other disks may spin at 1,200 rpm, 3,600 rpm, or in the range of 5,400 rpm to 7,200 rpm, though any range of speeds could be used.

Due to the extremely close spacing between the magnetic head and the spinning disk surface, HDDs are vulnerable to being damaged by a head crash—a failure of the disk in which the head scrapes across the platter surface, often grinding away the thin magnetic film and causing data loss. Head crashes can be caused by, among other things, electronic failure, a sudden power failure, physical shock, contamination of the drive's internal enclosure, wear and tear, corrosion, or poorly manufactured disks and heads.

BRIEF DESCRIPTION OF THE DRAWINGS

Various embodiments are depicted in the accompanying drawings for illustrative purposes, and should in no way be interpreted as limiting the scope of the inventions.

FIGS. 7-9 illustrate the self-aligning bracket of FIGS. 5 and 6.

FIG. 10 shows a cross-section of the self-aligning bracket taken along line 10-10 of FIG. 9.

FIG. 11 shows a cross-section of the self-aligning bracket taken along line 11-11 of FIG. 9.

DETAILED DESCRIPTION

One way to protect a HDD from a head crash is to provide protection from physical shock. For example, the hard drive 10 may be isolated from an enclosure and/or other components by shock mounts 20 that are positioned between the hard drive 10 and the enclosure.

Shock mounts 20 are often attached directly to the hard drive 10 and the hard drive is effectively suspended within the enclosure by way of the shock mounts. For example, a hard drive 10 may have two shock mounts 20 on one side and two additional shock mounts 20 on an opposite side. The shock mounts 20 can be a flexible material 22 attached to the hard drive via a custom designed screw or other fastener 24.

Figure 1:
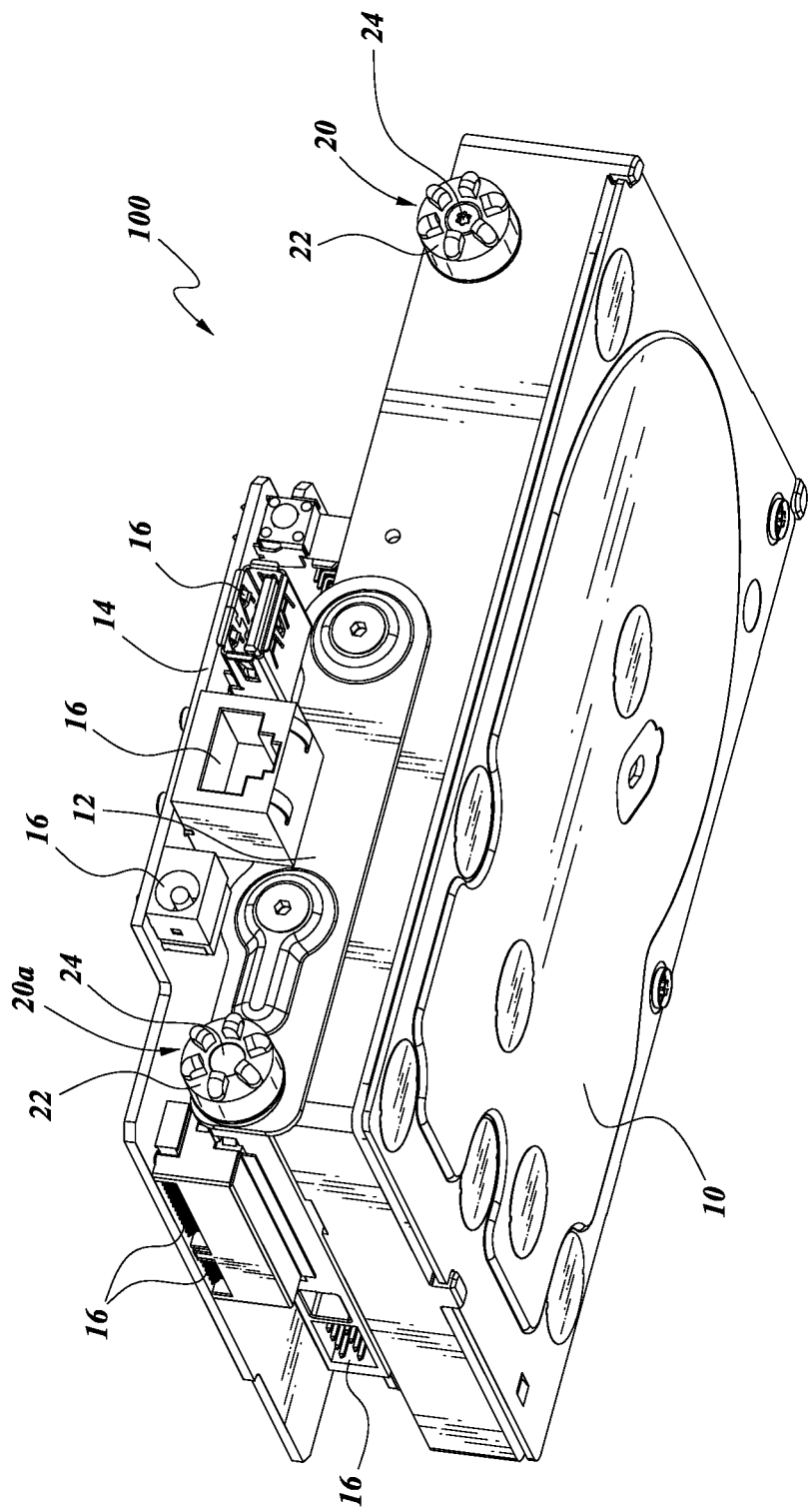
FIGS. 1 and 2 illustrate a storage drive assembly with a bracket for a shock mount.
Figure 2:
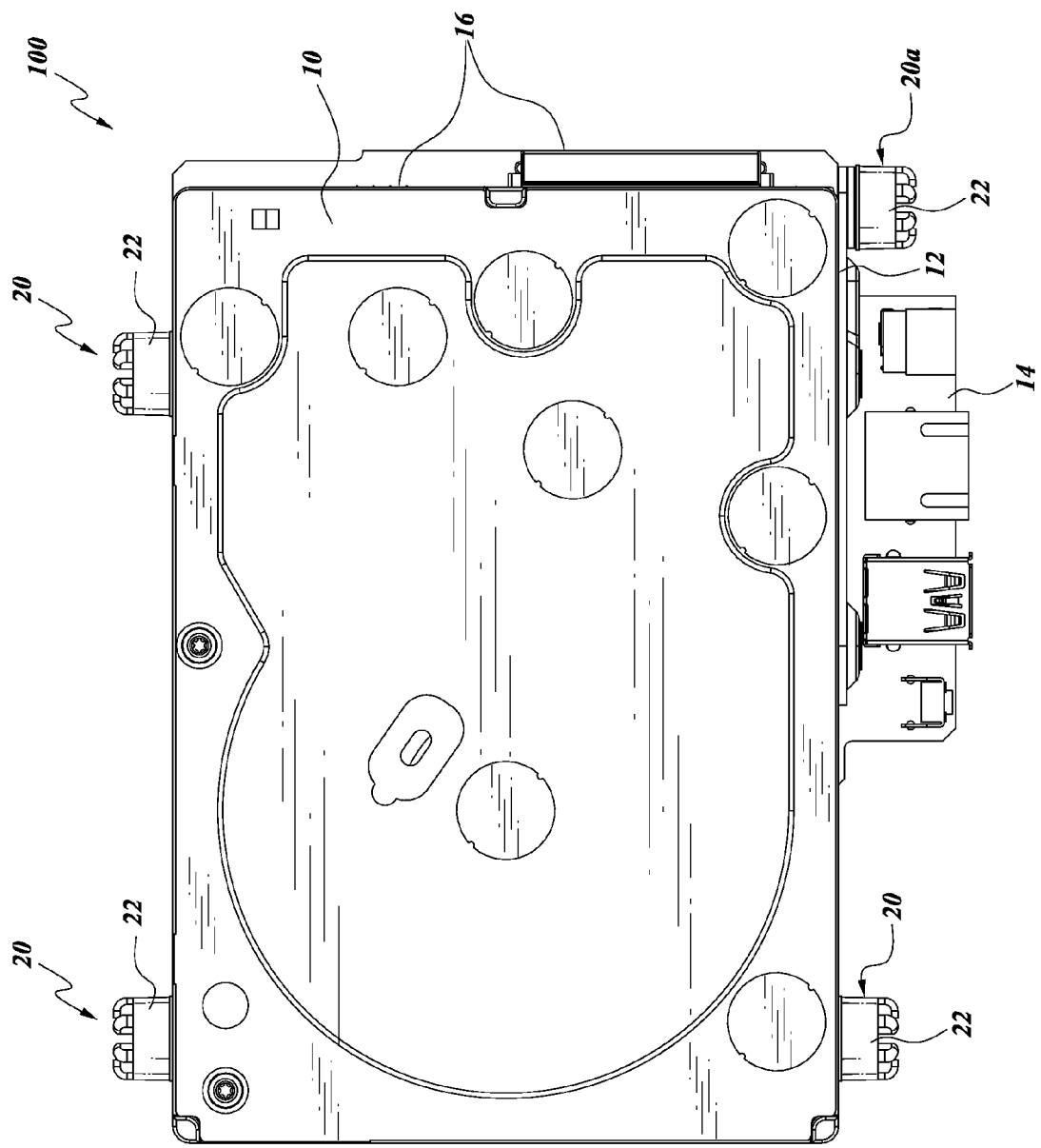

In some embodiments, one or more shock mount 20 may not be directly attached to the hard drive 10. For example, space constraints or other considerations may require that one or more shock mount 20a be attached to a separate bracket 12 that is then attached to the hard drive 10. FIGS. 1 and 2 illustrate one such example.

FIGS. 1 and 2 illustrate a storage drive assembly 100 with a bracket 12 for a shock mount 20a. As can be seen, the bracket 12 is used to move the shock mount 20a laterally to allow for the placement of a controller assembly 14 that partially overlaps the side of the hard drive 10.

Utilizing a separate bracket 12 to attach a shock mount 20a to a hard drive 10 can present certain unique challenges. In particular, alignment and positioning issues can be introduced into the system. Alignment issues may arise if the bracket 12 is not correctly positioned on the hard drive 10 when attached. The bracket 12 may also become misaligned during attachment.

Figure 3:
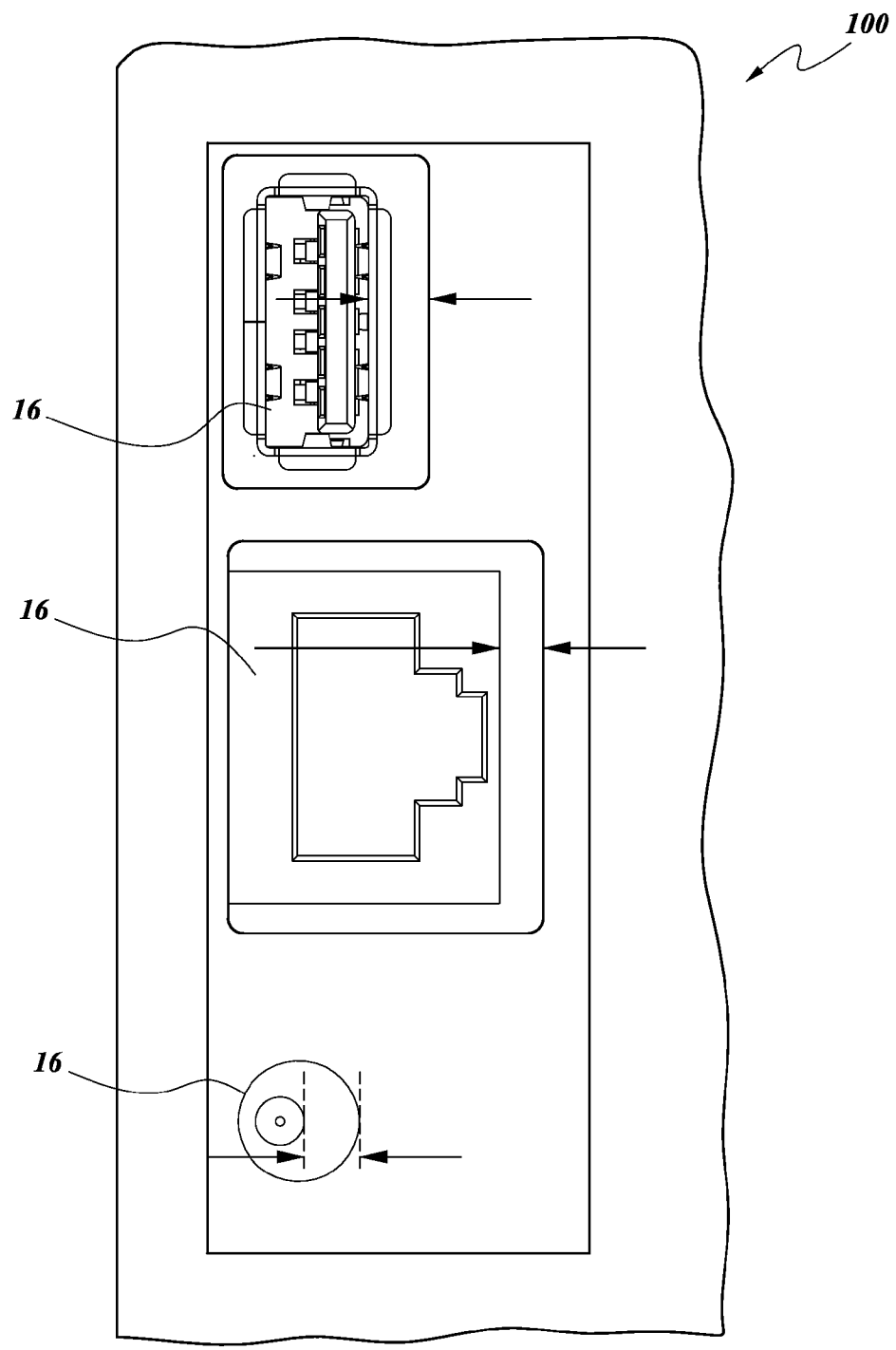
FIG. 3 shows misaligned connectors on a storage drive.

FIG. 3 shows misaligned connectors 16 on an assembled storage drive 100. This type of misalignment can result from problems with bracket positioning. As can be seen, there is a large gap on one side of the connectors and little to no gap on the opposite side. This may or may not affect the functionality of the storage drive assembly 100. Some plug in connectors may be prevented from connecting to the appropriate USB connector, power connector, Ethernet connector, etc. because of the misalignment. In addition, consumers have come to expect a high degree of precision and finish in electronic and computer components and may return a product that does not appear to be assembled correctly, even if the device works correctly.

Figure 4A:
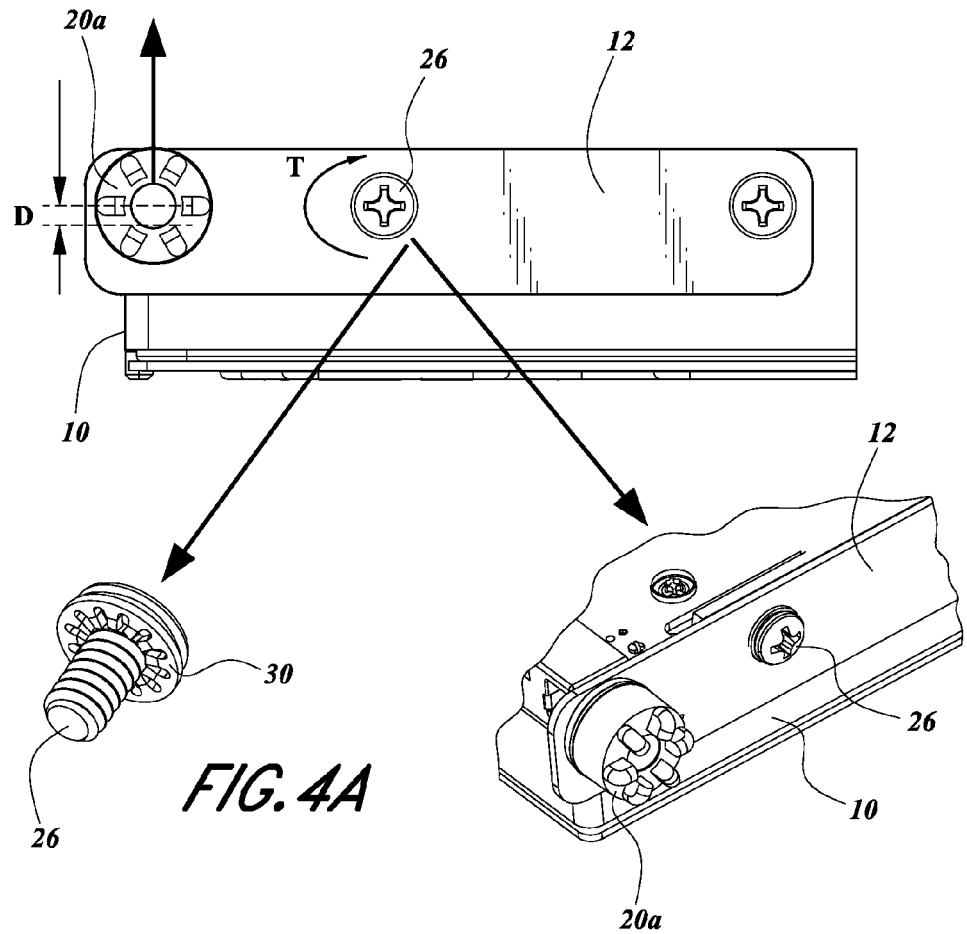
FIG. 4A illustrates how alignment issues can arise during assembly.

One common way that these issues may arise is during manufacturing when the bracket 12 is attached to the hard drive 10. For example, as illustrated in FIG. 4A, torqueing "T" of a screw 26 can cause the bracket 12 to rotate, even if only slightly. This rotation can cause the shock mount 20a to be a distance "D" higher or lower than the desired position. The bracket 12 can shift during the screw torqueing process due to the high friction moment between the bracket 12, the screw 26, and the washer 30 (such as a lock washer).

Commonly available fasteners, such as screws, have a high degree of variation in thread depth for the same sized screw. It is necessary to take this variation into account when designing holes in a bracket. This variation, combined with tolerances in the hole, generally means that the screw alone does not align the bracket. As a result, there can be some side to side and/or up and down movement of the bracket with respect to the screw. Of course, screws and brackets can be designed to fit together with very small tolerances, but this approach is generally cost prohibitive.

Figure 4B:
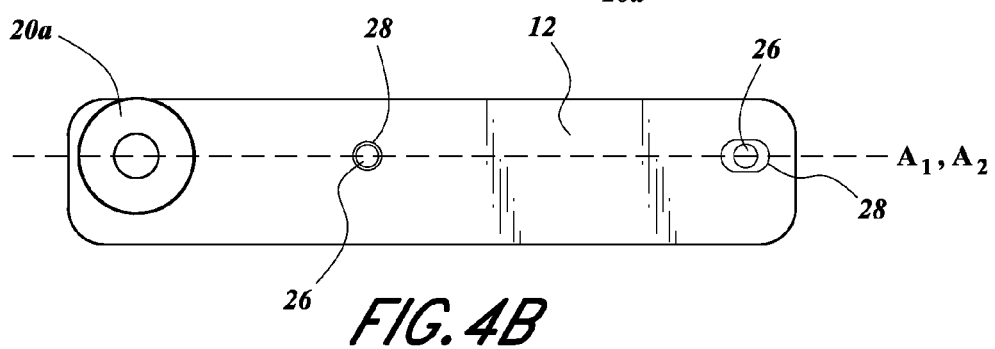
FIG. 4B is a theoretically perfect bracket alignment with both fasteners concentric with mating holes in the bracket.

FIG. 4B shows a theoretically perfect alignment between a bracket 12 and fasteners 26. Both fasteners 26 are concentric with mating holes 28 in the bracket 12. An axis line "$A_1$" drawn between the two fasteners 26 is parallel with an axis "$A_2$" through the center of the bracket 12.

Figure 4C:
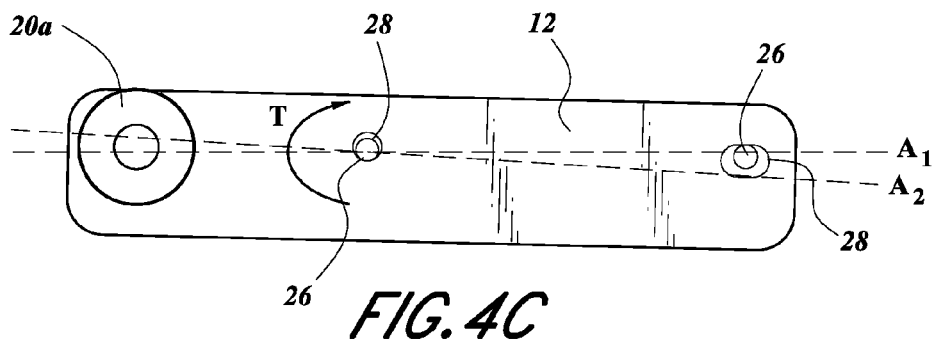
FIG. 4C shows a misaligned bracket.

FIG. 4C shows a misaligned bracket 12. Torqueing "T" of a screw 26 can cause the bracket 12 to become misaligned as the friction forces the bracket 12 to rotate. As shown, the axis "$A_2$" through the center of the bracket 12 is no longer parallel with the axis line "$A_1$" between the two fasteners 26. It will be understood that even without rotation, the bracket 12 can still become misaligned. In addition, it will also be understood that the farther the shock mount 20a is positioned from the fastener 26, the more a small error at the fastener can lead to a significant misalignment of the shock mount 20a.

In order to prevent misalignment of the bracket, a separate assembly fixture may be needed during manufacturing. Alternatively, or additionally, other procedures may need to be set in place to ensure proper alignment. Assembly fixtures and these other procedures increase both cost and complexity of the manufacturing process.

Figure 5:
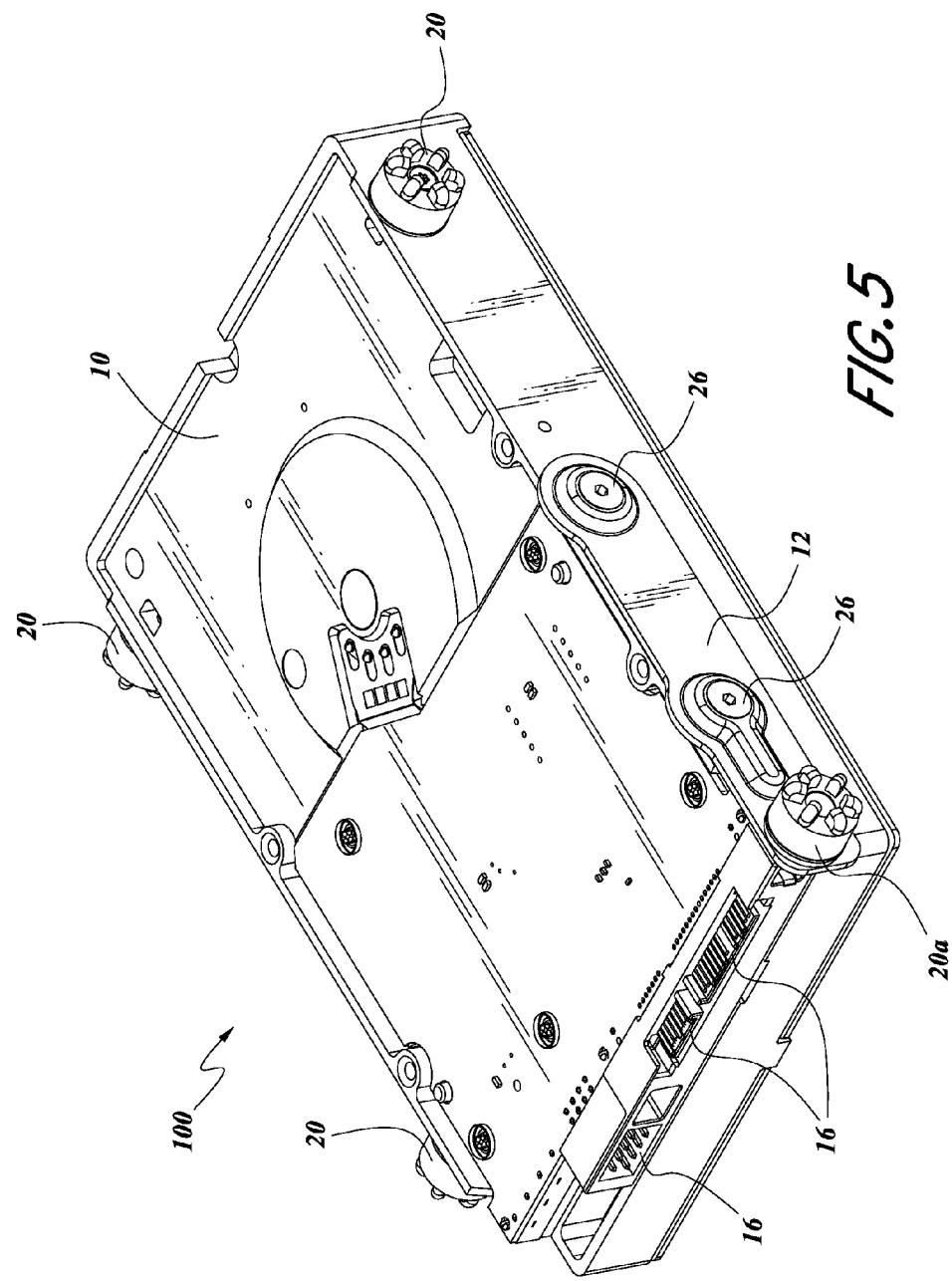
FIGS. 5 and 6 illustrate a storage drive assembly with a self-aligning bracket for a shock mount.
Figure 6:
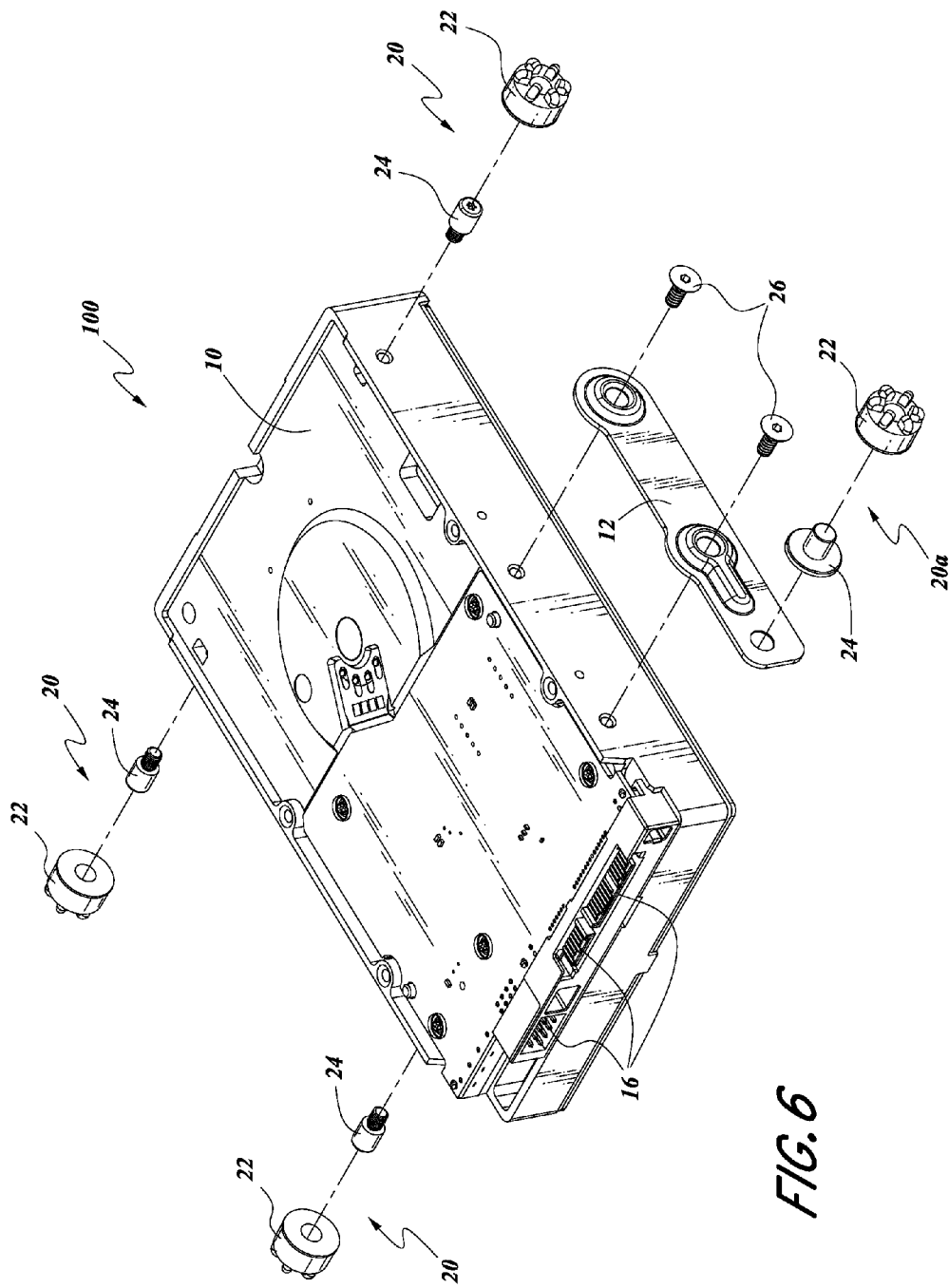

FIGS. 5 and 6 illustrate a storage drive assembly 100 with an improved bracket 12 for a shock mount. The bracket 12 can be self-aligning, as well as providing other features and benefits. It will be understood that the concepts described herein can be employed for other uses and with other devices, including, but not limited to, other types of storage drives, whether internal or external, computers, and all types of sensitive electronic devices. For example, the shock absorbing system may also be used with solid-state drives (SSD) and solid-state hybrid drives (SSHD).

The self-aligning bracket 12 for a shock mount of FIGS. 5 and 6 is shown in detail in FIGS. 7-11. A self-aligning bracket 12 can speed up the bracket installation process and improve alignment accuracy. For example, the self-aligning bracket 12 can be used with devices that require precise alignment of shock mounts in the horizontal and vertical planes for proper assembly.

The bracket 12 can attach to another device in many ways. Looking to FIG. 7, it can be seen that the bracket 12 can include one or more holes or openings 28, through which fasteners can pass to secure the bracket to another component, such as a hard drive. Two openings 28 are shown, though any number of different openings can be used. The bracket also has an opening 32 that can be used to connect a shock mount to the bracket 12. As has been mentioned, the principles described herein can be used for purposes other than, or in addition to a shock mounting system. In addition, it is not required for the bracket to have a hole 32 to connect the one or more shock mounts to the bracket.

Figure 12:
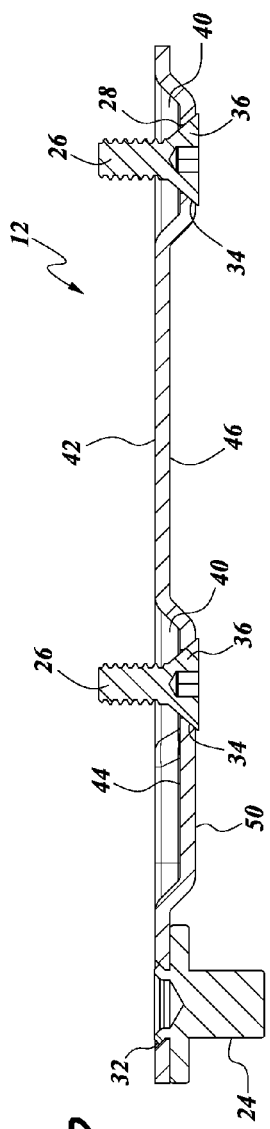
FIG. 12 shows a cross-section of the self-aligning bracket with screws and part of a shock mount.

The openings 28 on the bracket 12 can incorporate countersinks or angled chamfers 34, best seen in FIGS. 7 and 10. The angled chamfers 34 can provide the self-aligning feature of the bracket 12 when used with screws or bolts 26 having angled or countersunk heads 36 as shown in FIG. 12. During screw installation, the tapered surfaces of the angled chamfers and angled screw heads can align themselves and ensure precise bracket alignment to the disk drive. The angled chamfer 34 can be formed to match the angle of the head 36 of the mounting screw 26. In some embodiments the angles can be within a few degrees of one another. Larger differences in angles, such as 10 degrees or more, can work but may decrease the accuracy of the self-alignment.

In the illustrated embodiment, self-aligning chamfers 34 are used at each of the two mounting holes 28. A C'Sink screw 26 can be attached to each hole. C'Sink screws 26 are commonly angled at 82 degrees and the chamfer 34 can have a matching 82 degree angle, though the angles of the chamfer and the screw could be more or less than this. In addition, other types of screws or fasteners can be used which may have different standard angles; the most common being 60, 90, 100, 110, and 120 degrees.

The bracket can also include additional beneficial features in addition to being self-aligning. In some embodiments, the holes 28 in the bracket 12 are positioned on raised and/or sunken portions 38 of the bracket. Looking to FIGS. 7-11, it can be seen that the illustrated embodiment of the bracket is a flat plate with raised portions 38. The screws 26 can advance through the holes 28 of the bracket 12 at the raised portions 38 as shown in FIG. 12.

The raised or sunken portion 38 can form a space 40 between a first surface 42 of the bracket 12 and a surface 44 of the raised or sunken portion 38 (FIG. 10). Where the bracket is formed from a flat plate, the raised or sunken portion 38 with the surface 44 can be displaced from the flat plate and the first surface 42 to form the space 40. The bracket or flat plate can have a second surface 46 opposite the first surface 42.

Figure 13A:
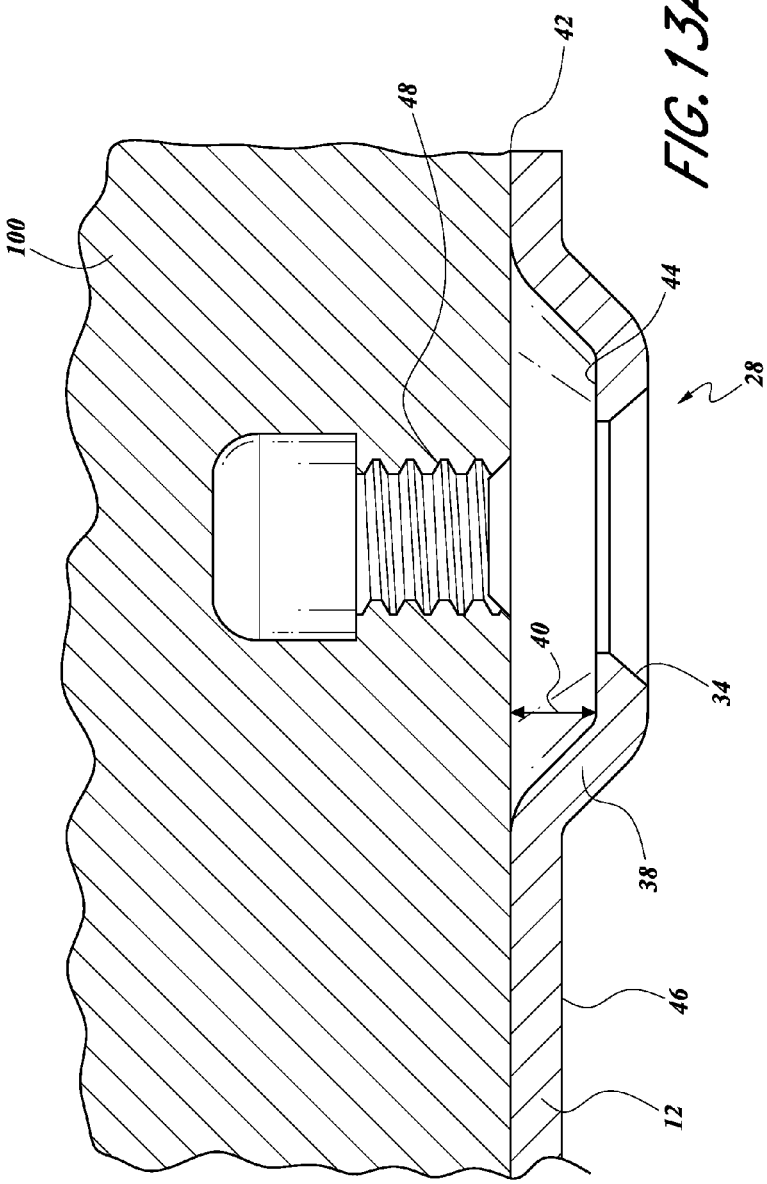
FIGS. 13A-B show the self-aligning bracket adjacent a storage drive in preassembled and assembled states, respectively.
Figure 13B:
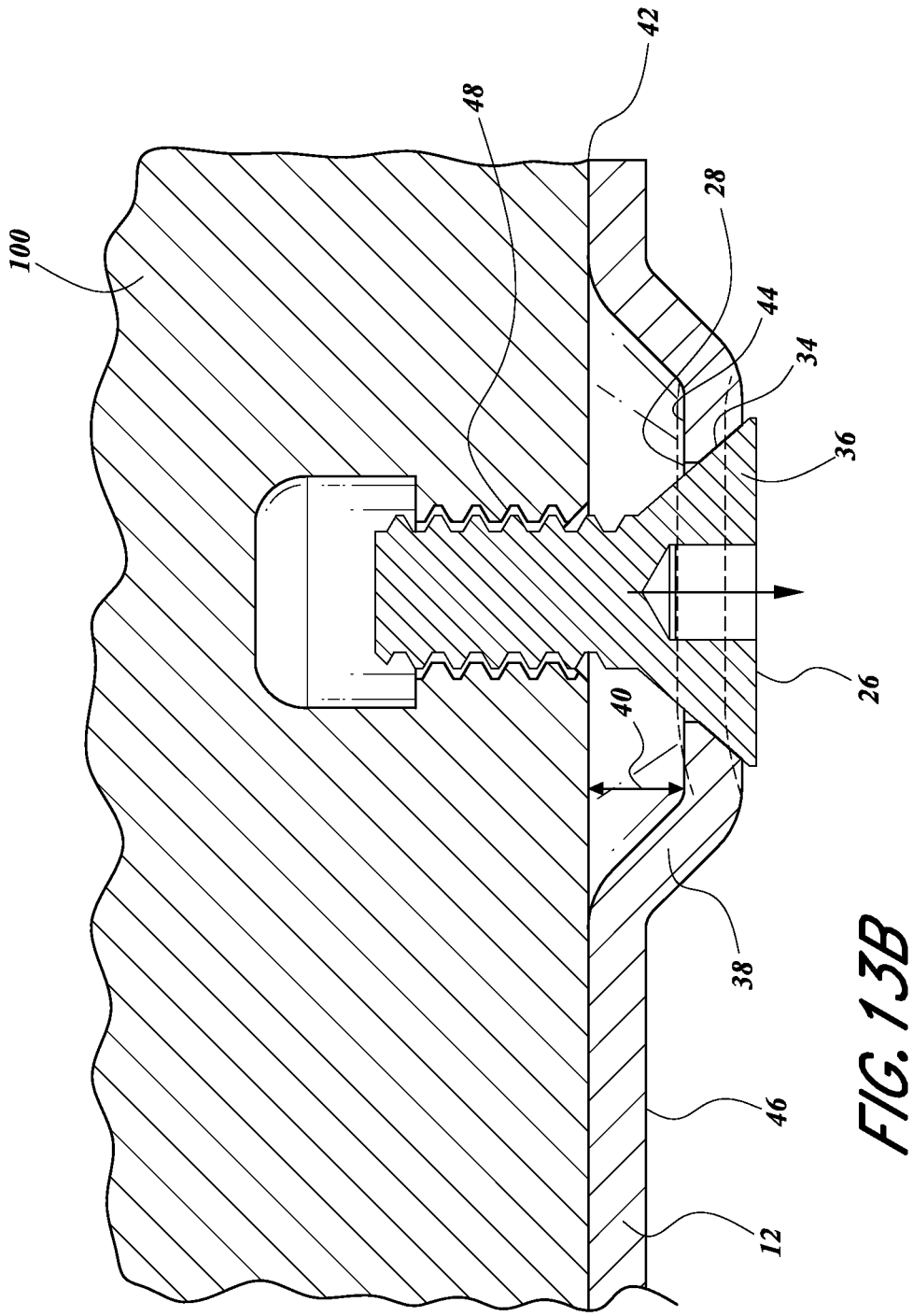

The bracket 12 can incorporate the raised or sunken portion 38 to provide a predetermined spacing 40 between the hard drive surface and a portion of the bracket (FIGS. 13A-B). This spacing 40 can allow for deflection of a portion of the bracket 12 as illustrated by the dashed lines on the raised or sunken portion 38 in FIG. 13B.

When torqueing the screw 26 during assembly, the raised portion 38 can deflect downward, creating an axial tension load on the screw. The arrow in FIG. 13B shows the screw tension force vector.

Axial load on a screw 26 connecting two components is a desired condition for a proper screw joined assembly. In this condition, the raised portion 38 forms a type of spring to create a spring force in the bracket 12. This spring force counteracts the force of the screw 26 and can deflect and change with temperature and other external variables to help the bracket 12 remain attached to the hard drive 10. This also has the benefit of allowing for a reduction in part count, as the locking washer 30 (see FIG. 4A) can be omitted. FIGS. 13A-B illustrate the spacing or gap between the hard drive 10 and the raised portion 38 and the deflection that can be experienced.

If necessary, the amount of spring force provided by the raised or sunken portion 38 can be controlled or changed by varying material properties at areas between the first surface 42 and the surface 44 of the raised or sunken portion 38. For example, the amount of spring force provided by the raised portion 38 can be controlled or changed by varying material properties at the transition areas between the first surface 42 and the surface 44. For example, additional holes can be formed in these areas, or the material thickness of these areas can be controlled. In some embodiments, the raised portion 38 can include additional openings that pass through the bracket in order to increase the amount of deflection that can be experienced by the raised portion 38.

In addition, the design of the raised portion 38 can provide compliance along multiple axes. In addition to being able to compress against the hard drive 10, the raised portion 38 can also be compliant from side to side and top to bottom.

The raised portion 38 be can one of many different shapes. The illustrated embodiments show a rounded dimple, but it may also have other shapes such as oval, rectangular, elliptical, and triangular.

In some embodiments the bracket 12 can be made of sheet metal. The raised or sunken portion 38 may be an embossed or stamped feature when made of sheet metal; other forming processes and materials can be used. For example, a sunken portion 38 can be milled or cut out from a piece of material. As another example, a raised portion 38 can be formed from milling the area around the raised portion 38 to create an offset surface. In some embodiments, the raised or sunken portion 38 may not have chamfers at the holes 28.

A self-aligning bracket assembly can be used for many purposes, including for attaching a shock mount 20a to a data storage device 10. The bracket assembly can include a plate 12 having a first side and a second side opposite the first side. A surface 42 of the plate 12 on the first side can be adjacent a data storage device 10 for mounting thereon. The plate 12 may further include a raised and/or sunken portion 38 forming an open space or gap 40 between the surface and the portion and thereby forming an open space between the plate 12 and the data storage device 10. An opening 28 can extend through the plate 12 at the raised or sunken portion 38. The opening can have a chamfer 34 formed in the plate to receive a screw 26 for mounting the bracket assembly. When used for a shock mount, the bracket assembly may further include a shock mount 20a extending from the plate 12.

As illustrated in FIG. 12, the bracket 12 can include a post 24 attached to the bracket. The post 24 can connect to the opening 32. The post 24 can attach with a separate fastener, or it can be threaded or it can be a rivet. Other attachment methods can also be used. A shock absorbing material 22 can attach to the post 24 to form the shock mount 20a (FIG. 6). Other shock mount systems can also be used.

Turning back to FIGS. 7-11 and 12, it can be seen that the bracket 12 can also include a reinforcing ridge 50. The reinforcing ridge 50 may be an extension of the raised portion 38 at the hole 28, or it may be a separate feature. The reinforcing ridge 50 can increase the rigidity of the bracket 12. The reinforcing ridge 50 is preferably positioned adjacent the shock mount 20a. In some embodiments, the reinforcing ridge 50 is positioned between the shock mount 20a and the nearest mounting hole 28 in the bracket 12. The reinforcing ridge 50 can decrease any deflection or bending between the shock mount 20a and the attachment locations 28 between the bracket 12 and the hard drive 10.

The described self-aligning bracket 12 provides many advantages and benefits. The self-aligning bracket 12 can provide improved bracket alignment accuracy, faster bracket installation time, reduction in part count and cost, and does not require a separate installation fixture. The self-aligning bracket 12 can allow for consistent and accurate attachment to other devices.

A self-aligning bracket assembly for attaching a shock mount 20a to a data storage device (e.g., HDD) 10 can be provided. The bracket assembly can include at least one chamfered opening 34, 28 for receiving a screw 26 for mounting the bracket assembly to the data storage device, and wherein, when mounted on the data storage device, the bracket provides a gap 40 between the at least one chamfered opening 34, 28 and the surface of the data storage device 10. The bracket may further include a shock mount 20a.

The bracket assembly in some embodiments may include a reinforcing ridge 50. The reinforcing ridge 50 can be positioned between the shock mount 20a and the closest chamfered opening 34, 28. The reinforcing ridge 50 can be an extension of a raised portion 38 of the bracket assembly forming the gap 40.

According to some embodiments, a self-aligning bracket assembly can be used to attach a shock mount to a data storage device. The bracket assembly can include an elongate plate having a first side and a second side opposite the first side, and a shock mount extending from the plate. The plate can comprise a first surface, a first sunken portion, and a first opening. The first surface is on the first side of the plate and be can configured to be placed adjacent a data storage device when the bracket assembly is mounted on the data storage device. The first sunken portion can be on the first side displaced from the first surface forming an open space between the first surface and the first sunken portion and thereby configured to form an open space on the first side between the plate and the data storage device when the bracket assembly is mounted on the data storage device. The first opening can extend through the plate from the second side to the first side at the first sunken portion. The first opening can have a first chamfer formed in the second side of the plate and configured for receiving a screw for mounting and self-aligning the bracket assembly to the data storage device. The first opening can be positioned at the first sunken portion to allow for deflection of the sunken portion upon mounting to the data storage device with the screw.

According to some embodiments, the bracket assembly can further include a reinforcing ridge extending along the plate positioned between the shock mount and the first opening. The reinforcing ridge can be an extension of the first sunken portion of the plate.

In some further embodiments, the first sunken portion can be a rounded dimple. The plate can be made of sheet metal and the first sunken portion can be an embossed or stamped feature in the sheet metal.

The bracket assembly may further include a second sunken portion and a second opening extending through the plate from the second side to the first side at the second sunken portion. The second opening can have a second chamfer formed in the second side of the plate. If the bracket assembly includes a reinforcing ridge, it can extend along the plate positioned between the shock mount and the first opening. The reinforcing ridge can be an extension of the first sunken portion of the plate.

In some embodiments, the shock mount extends from the second side of the plate. The shock mount can be positioned adjacent one end of the plate, but can also be in the middle, or at some other location.

According to some embodiments, a self-aligning bracket assembly for attaching to another component can comprise an elongate plate having a first side and a second side opposite the first side. The plate can comprise a first surface on the first side configured to be adjacent a data storage device when the bracket assembly is mounted on the data storage device. The plate can further include at least one sunken portion on the first side displaced from the first surface forming an open space between the first surface and the at least one sunken portion and thereby configured to form an open space on the first side between the plate and the data storage device when the bracket assembly is mounted on the data storage device. A first opening can extend through the plate from the second side to the first side at the at least one sunken portion. The first opening can have a first chamfer formed in the second side of the plate and configured for receiving a first screw for mounting the bracket assembly to the data storage device. A second opening can extend through the plate from the second side to the first side at the at least one sunken portion. The second opening can have a second chamfer formed in the second side of the plate and be configured for receiving a second screw for mounting the bracket assembly to the data storage device.

The bracket assembly can further comprise a reinforcing ridge extending along the plate positioned between the shock mount and the first opening. The reinforcing ridge can be an extension of the at least one sunken portion of the plate.

The at least one sunken portion can comprise a first sunken portion and second sunken portion. The first opening can extend through the plate at the first sunken portion and the second opening can extend through the plate at the second sunken portion. Each of the first and second sunken portions can comprise a rounded dimple. A reinforcing ridge can extend along the plate. The reinforcing ridge can extend from the rounded dimple of the first sunken portion.

In some embodiments, the bracket assembly can further include a shock mount extending from the second side of the plate, and the bracket assembly can be for attaching a shock mount to the other component, such as a data storage device.

A system of certain embodiments can comprise the bracket assembly and a data storage device. The bracket assembly can be coupled to one side of the data storage device.

In some embodiments, a self-aligning bracket assembly for attaching a shock mount to a data storage device can comprise a plate having a first side and a second side opposite the first side and a shock mount extending from the plate. The plate can comprise a first surface on the first side configured to be adjacent a data storage device when the bracket assembly is mounted on the data storage device. The plate can further include a first raised portion on the second side displaced from the first surface forming an open space between the first surface and the first raised portion and thereby configured to form an open space on the first side between the plate and the data storage device when the bracket assembly is mounted on the data storage device. A first opening can extend through the plate at the first raised portion. The first opening can have a chamfer formed in the second side of the plate and configured for receiving a screw for mounting the bracket assembly to the data storage device.

As has been previously mentioned, it will be understood that the bracket assembly and features of the bracket assembly can be used for other purposes, not limited to storage drives.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above.

What is claimed is:

1. A system comprising:
   a data storage device;
   a fastener; and
   a self-aligning bracket assembly mounted on the data storage device for attaching a shock mount to the data storage device comprising:
      an elongate plate having a first side and a second side opposite the first side, the plate comprising:
         a first surface on the first side in contact with the data storage device;
         a first sunken portion on the first side displaced from the first surface forming an open space between the first surface and the first sunken portion and thereby forming an open space on the first side between the plate and the data storage device;
         a first opening extending through the plate from the second side to the first side at the first sunken portion, the first opening having a first chamfer formed in the second side of the plate having a head of the fastener positioned therein to mount and self-align the bracket assembly to the data storage device, the first opening positioned at the first sunken portion to allow for deflection of the sunken portion upon mounting to the data storage device with the fastener; and
      a shock mount extending from the plate.

2. The system of claim 1, further comprising a reinforcing ridge extending along the plate positioned between the shock mount and the first opening.

3. The system of claim 2, wherein the reinforcing ridge is an extension of the first sunken portion of the plate.

4. The system of claim 1, wherein the first sunken portion comprises a rounded dimple.

5. The system of claim 1, wherein the plate comprises sheet metal and the first sunken portion is an embossed or stamped feature in the sheet metal.

6. The system of claim 1, further comprising a second sunken portion and a second opening extending through the plate from the second side to the first side at the second sunken portion, the second opening having a second chamfer formed in the second side of the plate.

7. The system of claim 6, further comprising a reinforcing ridge extending along the plate positioned between the shock mount and the first opening.

8. The system of claim 7, wherein the reinforcing ridge is an extension of the first sunken portion of the plate.

9. The system of claim 1, wherein the shock mount extends from the second side of the plate.

10. The system of claim 1, wherein the shock mount is positioned adjacent one end of the plate to thereby space the shock mount away from electrical connectors on the data storage device that are adjacent the first opening.

11. A system comprising:
    an electronic component;
    first and second fasteners; and
    a self-aligning bracket assembly attached to the electronic component comprising:
       an elongate plate having a first side and a second side opposite the first side, the plate comprising:
          a first surface on the first side adjacent the electronic component;
          at least one sunken portion on the first side displaced from the first surface forming an open space between the first surface and the at least one sunken portion and thereby forming an open space on the first side between the plate and the electronic component;
          a first opening extending through the plate from the second side to the first side at the at least one sunken portion, the first opening having a first chamfer formed in the second side of the plate receiving a head of the first fastener thereby securing the bracket assembly to the electronic component; and
          a second opening extending through the plate from the second side to the first side at the at least one sunken portion, the second opening having a second chamfer formed in the second side of the plate receiving a head of the second fastener thereby further securing the bracket assembly to the electronic component.

12. The system of claim 11, wherein the at least one sunken portion comprises a first sunken portion and a second sunken portion, the first opening extending through the plate at the first sunken portion and the second opening extending through the plate at the second sunken portion.

13. The system of claim 12, wherein each of the first and second sunken portions comprise a rounded dimple.

14. The system of claim 13, further comprising a reinforcing ridge extending along the plate, the reinforcing ridge extending from the rounded dimple of the first sunken portion.

15. The system of claim 11, wherein the plate comprises sheet metal and the at least one sunken portion is an embossed or stamped feature in the sheet metal.

16. The system of claim 11, further comprising a shock mount extending from the second side of the plate.

17. The system of claim 16, further comprising a reinforcing ridge extending along the plate positioned between the shock mount and the first opening.

18. The system of claim 17, wherein the reinforcing ridge is an extension of the at least one sunken portion of the plate.

19. The system of claim 11, wherein the electronic component is a data storage device.

20. A system comprising:
   a data storage device;
   a self-aligning bracket assembly for attaching a shock mount to the data storage device, the self-aligning bracket assembly mounted on the data storage device and comprising:
      a plate having a first side and a second side opposite the first side, the plate comprising:
         a first surface on the first side adjacent the data storage device;
         a first raised portion on the second side displaced from the first surface forming an open space between the first surface and the first raised portion and thereby forming an open space on the first side between the plate and the data storage device;
         a first opening extending through the plate at the first raised portion, the first opening having a first chamfer formed in the second side of the plate; and
      a shock mount extending from the plate at a location spaced away from the first opening; and
   a fastener positioned in the first opening securing the self-aligning bracket assembly to the data storage device.

21. The system of claim 20, further comprising an enclosure and three additional shock mounts fastened to the data storage device, the data storage device suspended within the enclosure by the shock mounts.

22. The system of claim 11, further comprising four shock mounts, wherein three of the shock mounts are secured directly to the electronic component and one of the shock mounts is secured to the elongate plate at a location spaced away from both of the first and second openings.

* * * * *